United States Patent
Jung

(10) Patent No.: US 9,583,423 B2
(45) Date of Patent: Feb. 28, 2017

(54) SEMICONDUCTOR DEVICE AND METHOD OF MANUFACTURING THE SAME

(71) Applicant: SK hynix Inc., Gyeonggi-do (KR)

(72) Inventor: Woo Yung Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/531,671

(22) Filed: Nov. 3, 2014

(65) Prior Publication Data

US 2015/0371993 A1    Dec. 24, 2015

(30) Foreign Application Priority Data

Jun. 20, 2014  (KR) .................. 10-2014-0075937

(51) Int. Cl.
*H01L 23/52*      (2006.01)
*H01L 23/498*     (2006.01)
(Continued)

(52) U.S. Cl.
CPC .......... *H01L 23/498* (2013.01); *H01L 21/764* (2013.01); *H01L 27/11519* (2013.01); *H01L 27/11556* (2013.01); *H01L 27/11565* (2013.01); *H01L 27/11582* (2013.01); *H01L 2924/0002* (2013.01)

(58) Field of Classification Search
CPC .......... H01L 27/1025; H01L 27/10805; H01L 27/10847; H01L 27/10894; H01L 27/11206; H01L 27/11531; H01L 27/11558; H01L 21/8229; H01L 21/8239; H01L 27/1023; H01L 27/1024; H01L 27/1026; H01L 27/1052; H01L 27/108; H01L 27/11
See application file for complete search history.

(56) References Cited

U.S. PATENT DOCUMENTS

| 2010/0207190 A1* | 8/2010 | Katsumata ......... G11C 16/0483 257/319 |
| 2011/0298013 A1* | 12/2011 | Hwang ............. H01L 27/11551 257/208 |

(Continued)

FOREIGN PATENT DOCUMENTS

KR    1020140031755    3/2014

OTHER PUBLICATIONS

U.S. Appl. No. 14/588,693, filed Jan. 2014, Lee.*
U.S. Appl. No. 12/886,854, filed Jul. 2010, Fukuzumi et al.*
U.S. Appl. No. 13/083,775, filed Apr. 2011, Alsmeier.*

*Primary Examiner* — Earl Taylor
*Assistant Examiner* — Samuel Park
(74) *Attorney, Agent, or Firm* — IP & T Group LLP

(57) ABSTRACT

A semiconductor device includes a stacked structure including conductive layers and insulating layers stacked alternately with each other, first semiconductor patterns passing through the stacked structure and arranged in a first direction, second semiconductor patterns passing through the stacked structure and arranged in the first direction, wherein the second semiconductor patterns are adjacent to the first semiconductor patterns in a second direction crossing the first direction, air gaps located between the first semiconductor patterns and the second semiconductor patterns and extending in the first direction, and at least one blocking pattern passing through the stacked structure and filling portions of the air gaps.

17 Claims, 9 Drawing Sheets

(51) Int. Cl.
　　　*H01L 21/764*　　　(2006.01)
　　　*H01L 27/115*　　　(2006.01)

(56) References Cited

U.S. PATENT DOCUMENTS

| 2012/0092926 A1* | 4/2012 | Whang | H01L 27/11556 |
| | | | 365/185.01 |
| 2015/0243675 A1* | 8/2015 | Lim | H01L 27/11582 |
| | | | 257/324 |

* cited by examiner

_US 9,583,423 B2_

SEMICONDUCTOR DEVICE AND METHOD OF MANUFACTURING THE SAME

CROSS-REFERENCE TO RELATED APPLICATION

The present application claims priority to Korean patent application number 10-2014-0075937, filed on Jun. 20, 2014, the entire disclosure of which is herein incorporated by reference in its entirety.

BACKGROUND

Field of Invention

Various exemplary embodiments relate generally to a semiconductor device and a method of manufacturing the same and, more particularly, to a semiconductor device having a three-dimensional structure and a method of manufacturing the same.

Non-volatile memory devices retain stored data in the absence of a power supply. Two-dimensional memory devices, in which memory cells are fabricated in a single layer over a silicon substrate, have reached limits in increasing their degree of integration. Accordingly, three-dimensional non-volatile memory devices, in which memory cells are stacked in a vertical direction over a silicon substrate, have been proposed.

A three-dimensional non-volatile memory device has a structure in which interlayer insulating layers and gate electrodes are stacked alternately with each other, and channel layers penetrate therethrough. Memory cells may be stacked along the channel layers. In addition, when the three-dimensional non-volatile memory device is manufactured, a plurality of oxide layers and a plurality of nitride layers are alternately stacked, and the plurality of nitride layers are replaced with a plurality of conductive layers, so that the stacked gate electrodes are formed.

However, it is difficult to perform the process of replacing the plurality of nitride layers with the plurality of conductive layers. In addition, peripheral layers may be damaged when the nitride layers are replaced with the conductive layers, and characteristics of the memory device may be deteriorated.

SUMMARY

An embodiment is directed to a semiconductor device having an Improved manufacturing process and Improved characteristics, and a method of manufacturing the same.

A semiconductor device according to an embodiment may include a stacked structure including conductive layers and insulating layers stacked alternately with each other, first semiconductor patterns passing through the stacked structure and arranged in a first direction, second semiconductor patterns passing through the stacked structure and arranged in the first direction, wherein the second semiconductor patterns are adjacent to the first semiconductor patterns in a second direction crossing the first direction, air gaps located between the first semiconductor patterns and the second semiconductor patterns and extending in the first direction, and at least one blocking pattern passing through the stacked structure and filling portions of the air gaps.

A semiconductor device according to an embodiment may include a first slit insulating layer extending in a first direction, a second slit insulating layer extending in the first direction, a semiconductor pattern provided between the first and the second slit insulating layers, a first stack structure including air gaps and first insulating layers alternately stacked on each other and provided between the first slit insulating layer and the semiconductor pattern, a second stack structure including conductive layers and second insulating layers alternately stacked on each other and provided between the second slit insulating layer and the first stack structure, wherein the semiconductor pattern passes through the second stack structure, and a blocking pattern extending from the first slit insulating layer through the first stack structure to the semiconductor pattern, wherein the second direction is different from the first direction.

DETAILED DESCRIPTION

Figure 1A:
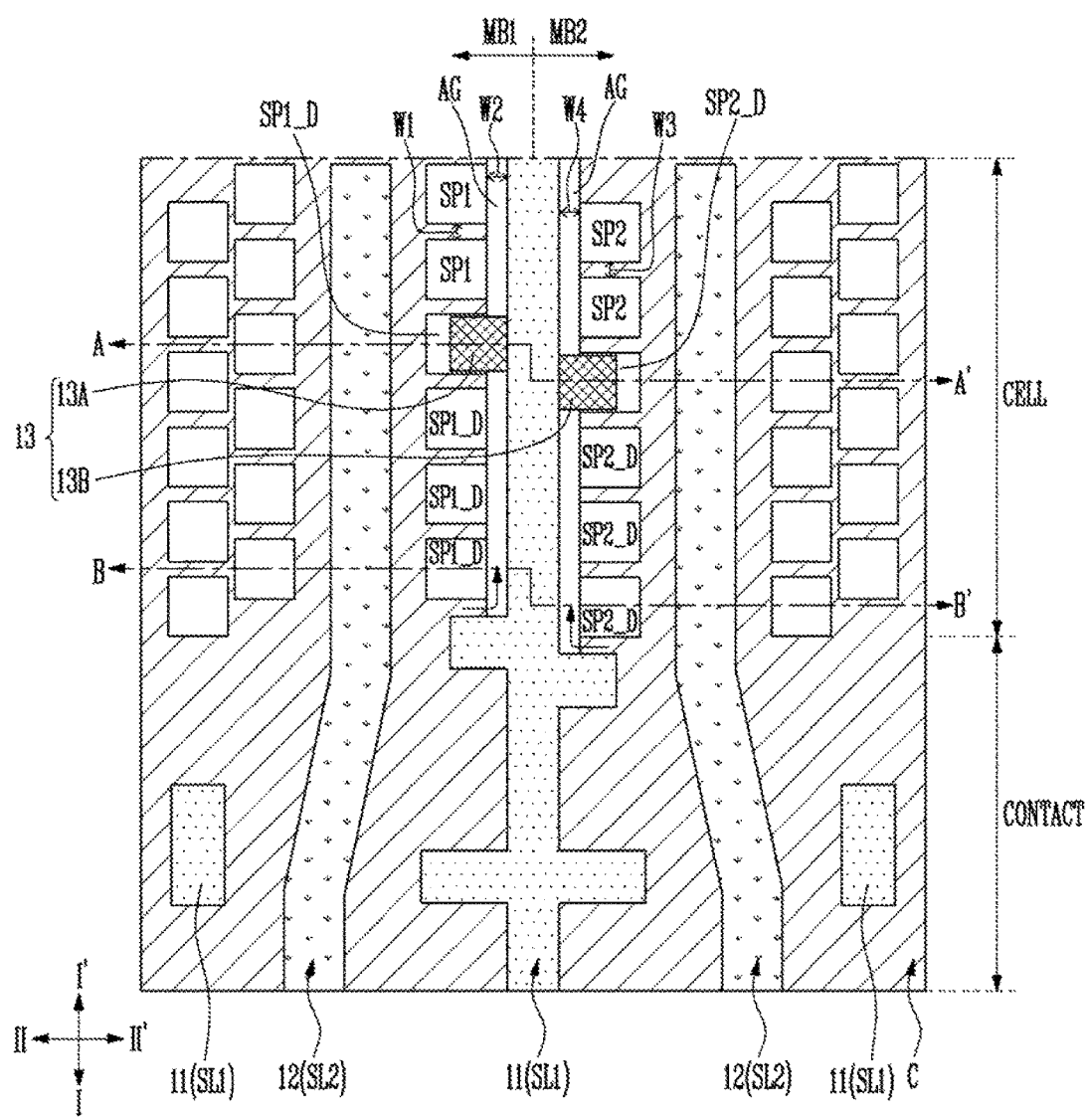
FIGS. 1A and 1B are layouts illustrating the structure of a semiconductor device according to an embodiment.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness of explanation. Like reference numerals refer to like elements throughout the specification and drawings.

Figure 1B:
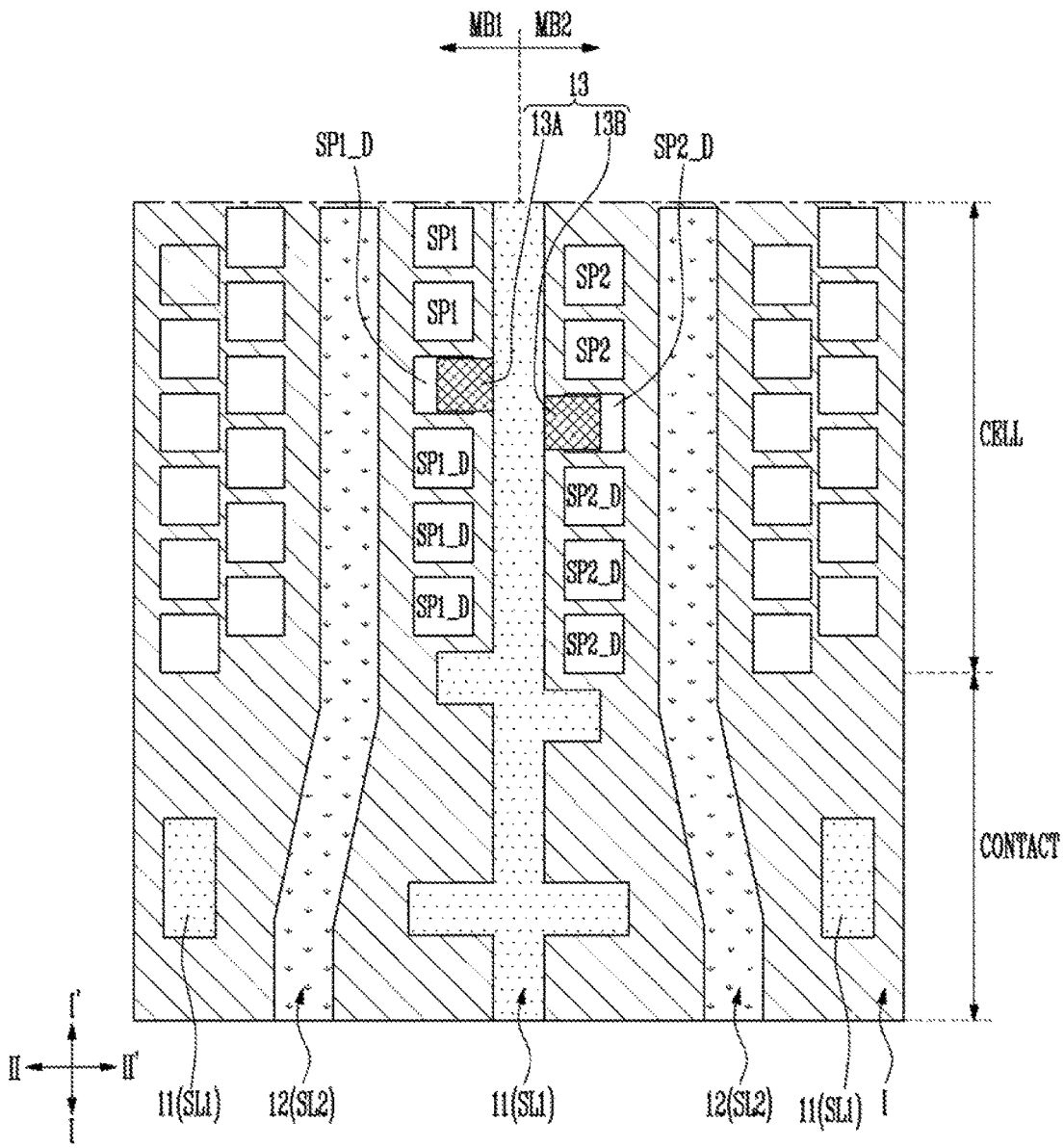

FIGS. 1A and 1B are layouts illustrating the structure of a semiconductor device according to an embodiment. More specifically, FIG. 1A is a layout with a conductive layer on the top, and FIG. 1B is a layout with an insulating layer on the top.

A semiconductor device according to an embodiment may include a stacked structure in which conductive layers C and insulating layers I are stacked alternately with each other. A lower structure including a substrate, a source layer, and a pipe gate may be located under the stacked structure. In addition, a cell region CELL and a contact region CONTACT may be defined in the stacked structure. In the contact region CONTACT, contact plugs may be provided and coupled to the stacked conductive layers C, respectively. For example, the contact region CONTACT of the stacked structure may be stepped.

In addition, the semiconductor device may include semiconductor patterns SP1 and SP2, a blocking pattern 13, first slit insulating layers 11 and second slit insulating layers 12 each of which passes through the stacked structure. An air gap is located between the semiconductor patterns SP1 and SP2 and extends in one direction. In the semiconductor device including the above structure, memory strings arranged in a vertical direction or in a U shape may be formed over the substrate.

The first and second slit insulating layers 11 and 12 may extend in a first direction I-I', perpendicular to the vertical direction, and be located between the semiconductor patterns SP1 and SP2. In addition, the first and second slit insulating layers 11 and 12 may be located in the cell region CELL, or extend from the cell region CELL to the contact region CONTACT. The first and second slit insulating layers 11 and 12 may include protrusions.

The first slit insulating layers 11 may be formed in first slits SL1 located at the boundary between a first memory block MB1 and a second memory block MB2 which are adjacent to each other so that the conductive layers C may be separated into memory block units. According to an embodiment, sacrificial layers stacked alternately with the insulating layers I may be removed through second slits SL2, and the conductive layers C may be formed in regions from which the sacrificial layers are removed. Therefore, the first slit insulating layers 11 may be located in the cell region CELL or the contact region CONTACT so that the first slit insulating layers 11 may be used as a support body supporting the remaining insulating layers I after the sacrificial layers are removed. In addition, the second slit insulating layers 12 may be formed in the second slits SL2. The first and second slit insulating layers 11 and 12 may be deep enough to pass through all the stacked conductive layers C.

The semiconductor patterns SP1 and SP2 may be located in the cell region CELL and be channel layers of the memory strings. In addition, some of the semiconductor patterns SP1 and SP2 which are adjacent to the contact region CONTACT may be dummy channel layers. Therefore, some of the semiconductor patterns SP1 and SP2 may be first and second dummy semiconductor patterns SP1_D and SP2_D which function as dummy channel layers.

In addition, the semiconductor patterns SP1 and SP2 may be arranged in a first direction I-I' and a second direction II-II' crossing the first direction I-I'. The first semiconductor patterns SP1 located on a left side of the first slit insulating layer 11 may be aligned with each other in the first direction I-I'. The second semiconductor patterns SP2 located on a right side of the first slit insulating layer 11 may be aligned with each other in the first direction I-I'. In addition, the first semiconductor pattern SP1 and the second semiconductor pattern SP2 which are adjacent to each other in the second direction II-II' may be offset from each other. For example, the first semiconductor pattern SP1 and the second semiconductor pattern SP2 may be arranged in a staggered manner.

A distance W1 between neighboring first semiconductor patterns SP1 in the first direction I-I' may be smaller than a distance W2 between the first semiconductor patterns SP1 and the first slit insulating layer 11 adjacent to each other. In addition, a distance W3 between neighboring second semiconductor patterns SP2 in the first direction I-I' may be smaller than a distance W4 between the second semiconductor patterns SP2 and the first slit insulating layer 11 adjacent to each other.

Referring to FIG. 1A, the air gap AG may be located between the first semiconductor patterns SP1 and the first slit insulating layer 11 and between the second semiconductor patterns SP2 and the first slit insulating layer 11. According to an embodiment, the conductive layer C may be formed by depositing a conductive material through the second slit SL2. Since the distance W1 between the first semiconductor patterns SP1 is smaller than the distance W2, the conductive material may be filled between the first semiconductor patterns SP1 before the conductive layer C is filled between the first semiconductor patterns SP1 and the first slit insulating layer 11. Therefore, the air gap AG remains in the conductive layers C. On the other hand, referring to FIG. 1B, the air gap AG may not be present in the insulating layer I. Therefore, the air gap AG may be interposed between the stacked insulating layers I, and the upper air gap AG and the lower air gap AG may be separated from each other by the insulating layer I.

The blocking pattern 13 may be formed to seal the air gap AG located in the cell region CELL, and include an insulating material or a semiconductor material. During the manufacturing process, an etchant may be used. The etchant may flow unintentionally into the cell region CELL through the air gap AG and damage neighboring layers (see arrow). Therefore, the blocking pattern 13 may be formed to fill the air gap AG so that the blocking pattern 13 may block the etchant from moving into the cell region CELL, in which the channel layers are located, through the air gap AG.

For example, in order to completely block a path of the etchant, the blocking pattern 13 may be formed to fill the air gap AG and directly contact the semiconductor patterns SP1 and SP2. In addition, the semiconductor patterns SP1_D and SP2_D located near the boundary between the cell region CELL and the contact region CONTACT, into which the etchant is likely to be introduced, may function as dummy channel layers. The dummy channel layers and the blocking pattern 13 may directly contact each other. Therefore, real channel layers may be prevented from being exposed to the etchant flowing through the air gap AG.

In addition, the blocking pattern 13 may contact the first slit insulating layer 11. For example, the blocking pattern 13 may include an insulating material and be connected to the first slit insulating layer 11. The blocking pattern 13 and the first slit insulating layer 11 may be integrated into a single body. For example, the first blocking pattern 13A contacting the first dummy semiconductor pattern SP1_D may be connected to the left side of the first slit insulating layer 11, and the second blocking pattern 13B contacting the second dummy semiconductor pattern SP2_D may be connected to the right side of the first slit insulating layer 11. Put differently, the first and the second blocking patterns 13A and 13B may extend from the first slit insulating layer 11. In addition, the first blocking pattern 13A and the second blocking pattern 13B may be configured either symmetrically or asymmetrically with respect to the first slit insulating layer 12. Though not shown in FIGS. 1A and 18B, sidewalls of the semiconductor patterns SP1 and SP2 may be surrounded by a multilayer dielectric layer. Likewise, sidewalls of the first dummy semiconductor pattern SP1_D and the second dummy semiconductor pattern SP2_D may be surrounded by the multilayer dielectric layer. The multilayer dielectric layer is denoted by reference numeral 33 in FIG. 3A. The multilayer dielectric layer may include a tunnel insulating layer, a data storage layer, a charge blocking layer, or a combination thereof. In addition, the data storage layer may include silicon, nitride, nanodots, phase-change material, or a combination thereof. The second blocking pattern 13B may pass through the multilayer dielectric layer and directly contact the first and second dummy semiconductor patterns SP1_D and SP_2. In other words, the multilayer dielectric layer may not be interposed between the first dummy semiconductor pattern SP1_D and the second blocking pattern 13B and between the second dummy pattern SP2_D and the second blocking pattern 13B.

Figure 2A:
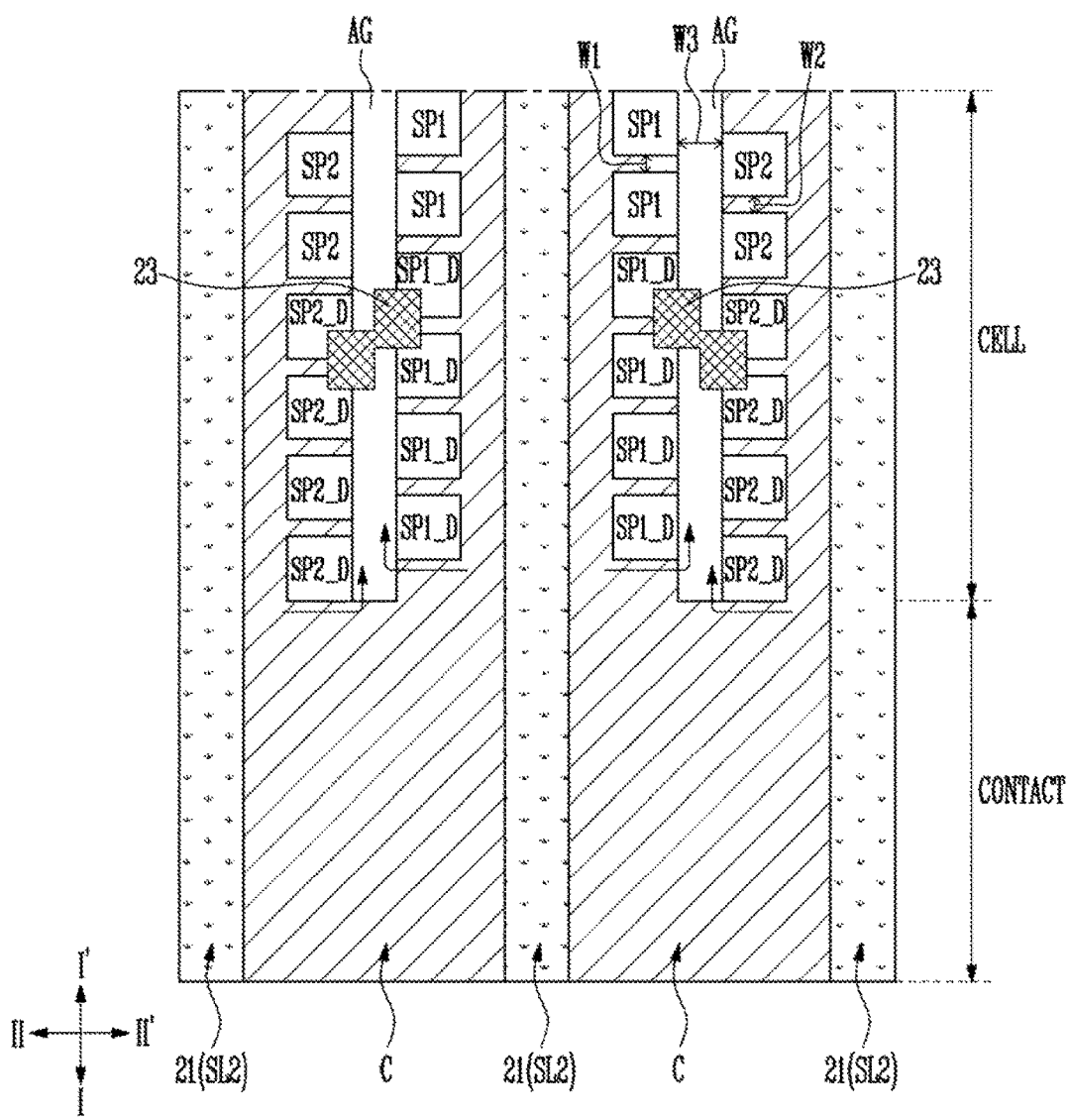
FIGS. 2A and 2B are views illustrating the structure of a semiconductor device according to an embodiment.
Figure 2B:
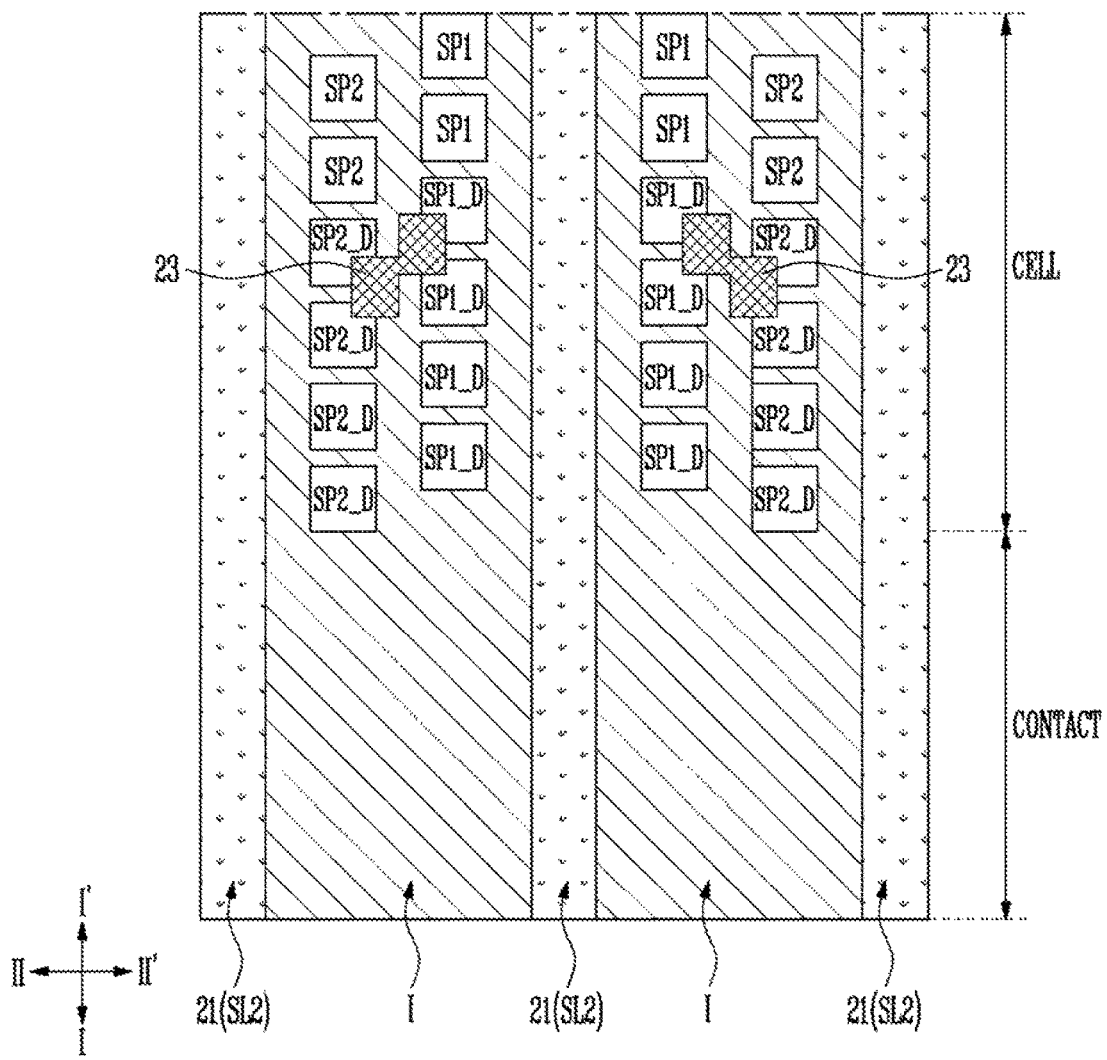

FIGS. 2A and 2B are views illustrating the structure of a semiconductor device according to an embodiment. More specifically, FIG. 2A is a layout showing a conductive layer on the top, and FIG. 2B is a layout showing an insulating layer on the top. Hereinafter, a description of common contents with FIGS. 1A and 1B is omitted.

A semiconductor device according to an embodiment may include a stacked structure in which the conductive layers C and the insulating layers I are stacked alternately with each other. In addition, the semiconductor patterns SP1 and SP2, a blocking pattern 23, and a second slit insulating layer 21 may pass through the stacked structure.

Referring to FIGS. 2A and 2B, the distance W1 between the neighboring first semiconductor patterns SP1 in the first direction I-I' may be smaller than the distance W3 between the first semiconductor pattern SP1 and the second semiconductor pattern SP2 adjacent to each other in the second direction II-II'. In addition, the distance W2 between the neighboring second semiconductor patterns SP2 in the first direction I-I' may be smaller than the distance W3 between the first semiconductor pattern SP1 and the second semiconductor pattern SP2 adjacent to each other in the second direction II-II'. Therefore, when the conductive layer C is formed through the second slit SL2, a conductive material may fill between the neighboring first semiconductor patterns SP1 in the first direction I-I' and between the neighboring second semiconductor patterns SP2 in the first direction I-I'. However, the conductive material may not fully fill between the first semiconductor pattern SP1 and the second semiconductor pattern SP2 adjacent to each other in the second direction II-II'. In other words, the air gap AG may still remain until after the conductive material fully fills between the neighboring first semiconductor patterns SP1 in the first direction I-I' and fully fills between the neighboring second semiconductor patterns SP2 in the first direction I-I' and between.

The blocking pattern 23 may be formed to partially fill the air gap AG in order to block a path (see arrow) through which an etchant flows into the cell region CELL. For example, the blocking pattern 23 may have various shapes such as a circle, an oval, or a polygon, and traverse the air gap AG. The blocking pattern 23 may contact the neighboring first and second dummy semiconductor patterns SP1_D and SP2_D which are arranged in the second direction II-II'. In addition, the blocking pattern 23 may contact two of the first dummy semiconductor patterns SP1_D and two of the second semiconductor patterns SP2_D in order to completely seal the air gap AG.

Figure 3A:
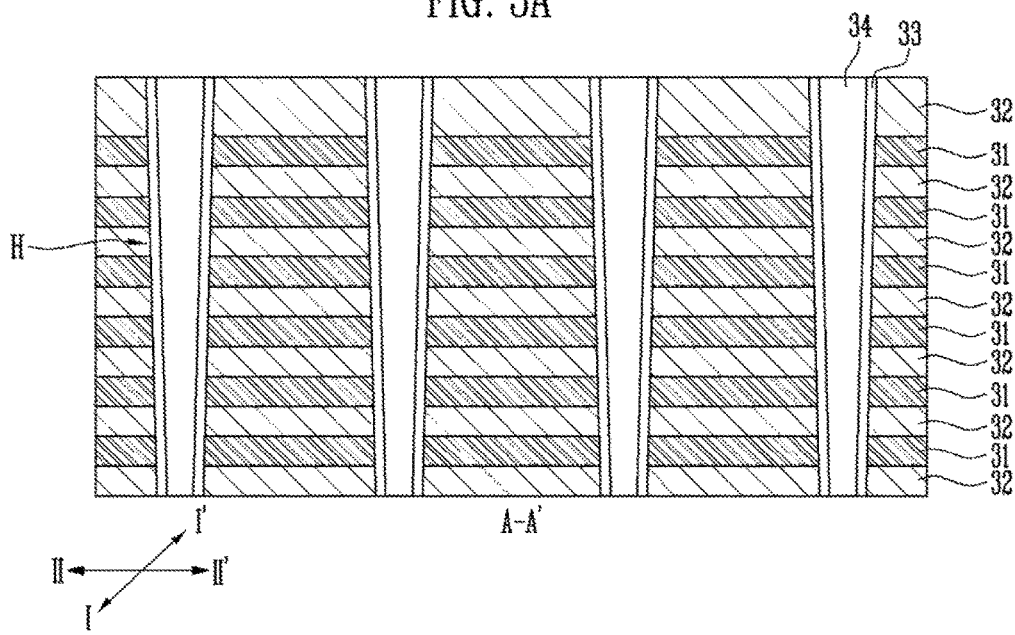
FIGS. 3A to 3F are cross-sectional views illustrating a method of manufacturing a semiconductor device according to an embodiment.
Figure 3B:
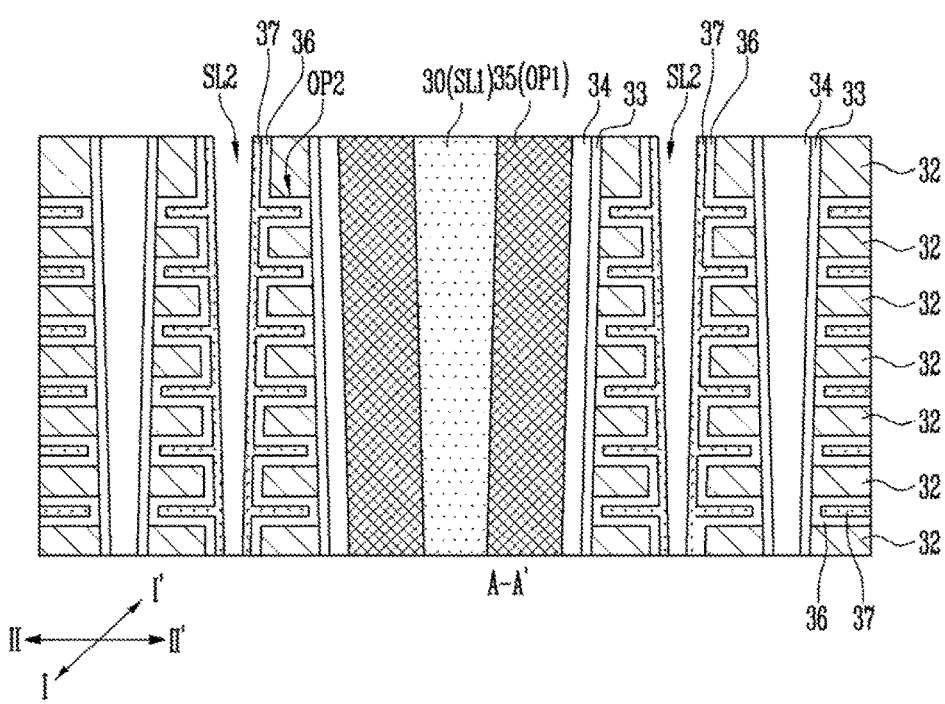
Figure 3C:
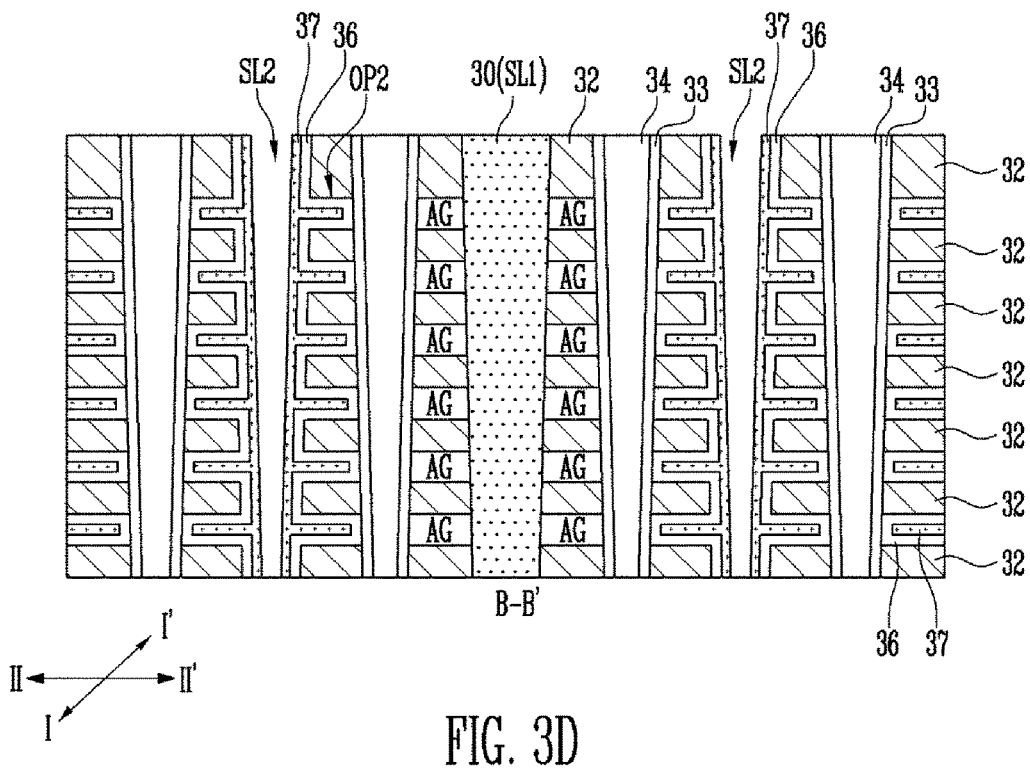

FIGS. 3A to 3F are cross-sectional views illustrating a method of manufacturing a semiconductor device according to an embodiment. FIGS. 3A, 3B, and 3D to 3F are cross-sectional views taken along line A-A' of FIG. 1A. FIG. 3C is a cross-sectional view taken along line B-B' of FIG. 1A.

As illustrated in FIG. 3A, sacrificial layers 31 and insulating layers 32 may be formed alternately with each other. The sacrificial layers 31 may include a material having a high etch selectivity with respect to the insulating layers 32. For example, the sacrificial layer 31 may include a nitride, and the insulating layer 32 may include an oxide.

Subsequently, holes H may be formed through the sacrificial layers 31 and the insulating layers 32, and multilayer dielectric layers 33 and semiconductor patterns 34 may be formed in the holes H. In an embodiment, some or all of the semiconductor patterns 34 may include an insulating layer in a center portion.

In addition, the semiconductor patterns 34 may be arranged in the first direction I-I' and the second direction II-II'. The distance W1 between neighboring semiconductor patterns 34 arranged in the first direction I-I' may be smaller than that between neighboring semiconductor patterns 34 arranged in the second direction II-II' (see FIGS. 1A and 2A).

As illustrated in FIGS. 3B and 3C, at least one first opening OP1 may be formed through the first and second material layers 31 and 32. The first opening OP1 may be located between neighboring semiconductor patterns 34 in the second direction II-II'. Subsequently, a blocking pattern 35 may be formed in the first opening OP1. For example, when the first opening OP1 is formed, the neighboring semiconductor patterns 34 in the second direction II-II' and the multilayer dielectric layers 33 surrounding the semiconductor patterns 34 may be partially etched, so that the semiconductor patterns 34 may be exposed through the first opening OP1. Therefore, the blocking pattern 35 may directly contact the neighboring semiconductor patterns 34 in the second direction II-II'.

When the first opening OP1 is formed, the first slit SL1 may also be formed (see FIG. 1A). The first slit SL1 may be located between the neighboring semiconductor patterns 34 in the second direction II-II'. The first slit SL1 may have a line shape extending in the first direction I-I'. The first opening OP1 and the first slit SL1 may be connected to each other. The first opening OP1 may be filled with a blocking pattern 35. The first slit SL1 may be filled with a first slit insulating layer 30. The blocking pattern 35 and the first slit insulating layer 30 may be connected to form a single insulating layer.

The first opening OP1 may also be formed when the holes H are formed. In this case, the semiconductor patterns 34 and the blocking pattern 35 may include the same material.

Subsequently, the second slit SL2 may be formed through the first and second material layers 31 and 32 and located between the semiconductor patterns 34. The second slit SL2 may be deep enough to expose the sacrificial layers 31. Subsequently, the sacrificial layers 31 may be removed through the second slit SL2 to form second openings OP2.

Subsequently, first barrier layers 36 and protective layers 37 may be formed in liner patterns along sidewalls of the second openings OP2 and the second slit SL2. For example, the first barrier layers 36 may include titanium, titanium nitride, tantalum, tantalum nitride, or a combination thereof. The protective layers 37 may include oxide, nitride, silicon oxide, silicon nitride, polysilicon, germanium, silicon germanium, or a combination thereof.

For example, a deposition gas may be introduced through the second slit SL2 so that the first barrier layer 36 and the protective layer 37 may be deposited over the sidewall of the second openings OP2 and over the sidewall of the second slit SL2. The distance between the neighboring semiconductor patterns 34 in the first direction I-I' may be smaller than the distance between the neighboring semiconductor patterns 34 in the second direction II-II'. Therefore, the first barrier layer 36 and the protective layer 37 may completely fill gaps between the neighboring semiconductor patterns 34 in the first direction I-I' before the first barrier layer 36 and the protective layer 37 sufficiently fill spaces between the neighboring semiconductor patterns 34 in the second direction II-II'. Therefore, as illustrated in FIG. 3C, the air gap AG may remain between the neighboring semiconductor patterns 34 in the second direction II-II'. The air gaps AG may be located between the first slit insulating layer 30 and the semiconductor patterns 34. The air gaps AG may be sandwiched between an upper insulating layer 32 and a lower insulating layer 32.

Figure 3D:
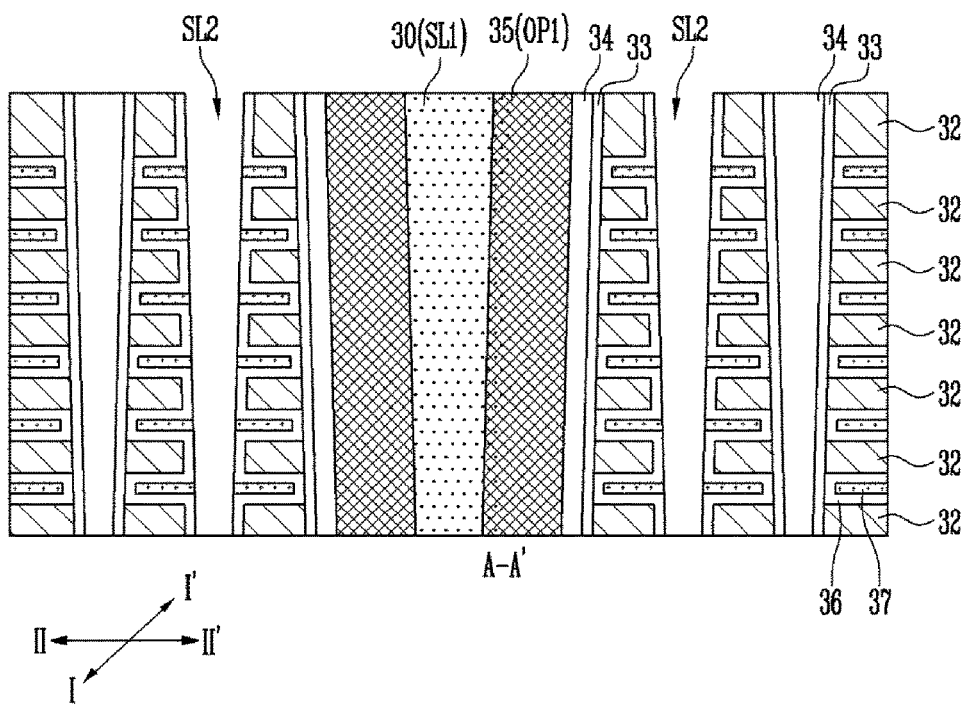
Figure 3E:
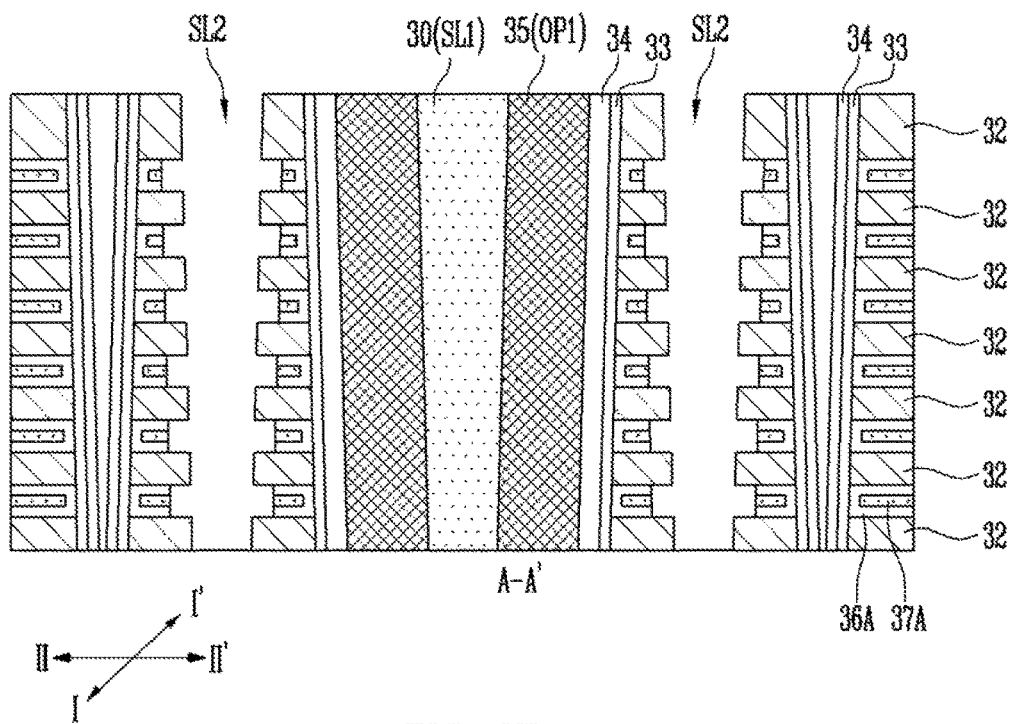

As illustrated in FIG. 3D, the first barrier layer 36 formed in the second slit SL2 may be exposed by partially removing the protective layer 37 formed over a sidewall of the second slit SL2. Subsequently, as illustrated in FIG. 3E, the first barrier layer 36 and the protective layer 37 may be subject to a recess etching, resulting into first barrier patterns 36A and protective patterns 37A. For example, the first barrier patterns 36A may be formed by etching the first barrier layer 36 by using the protective layer 37 as an etch barrier. Subsequently, the protective patterns 37A may be formed by etching the protective layer 37 by using the first barrier patterns 36A as an etch barrier. As a result, portions of the second openings OP2 adjacent to the second slit SL2 may be re-opened, and the first barrier patterns 36A and the protective pattern 37A may be formed in the second openings OP2 in a recessed manner. A step may be formed between a stack of the first barrier patterns 36A and the protective pattern 37A, which is recessed in the second openings OP2, and the sidewall of the second slit SL2.

An etchant for etching the protective layer 37 may flow from a boundary between the cell region CELL and the contact region CONTACT to the cell region CELL through the air gap AG. The etchant flowing into the air gap AG may move along the air gap AG toward the cell region CELL and damage the multilayer dielectric layer 33, the semiconductor pattern 34, and the first barrier pattern 36A which are already formed in the cell region CELL. However, according to an embodiment, since the air gap AG of the cell region CELL is sealed by the blocking pattern 35, the etchant may be prevented from moving to the cell region CELL and damaging the layers formed in the cell region.

Figure 3F:
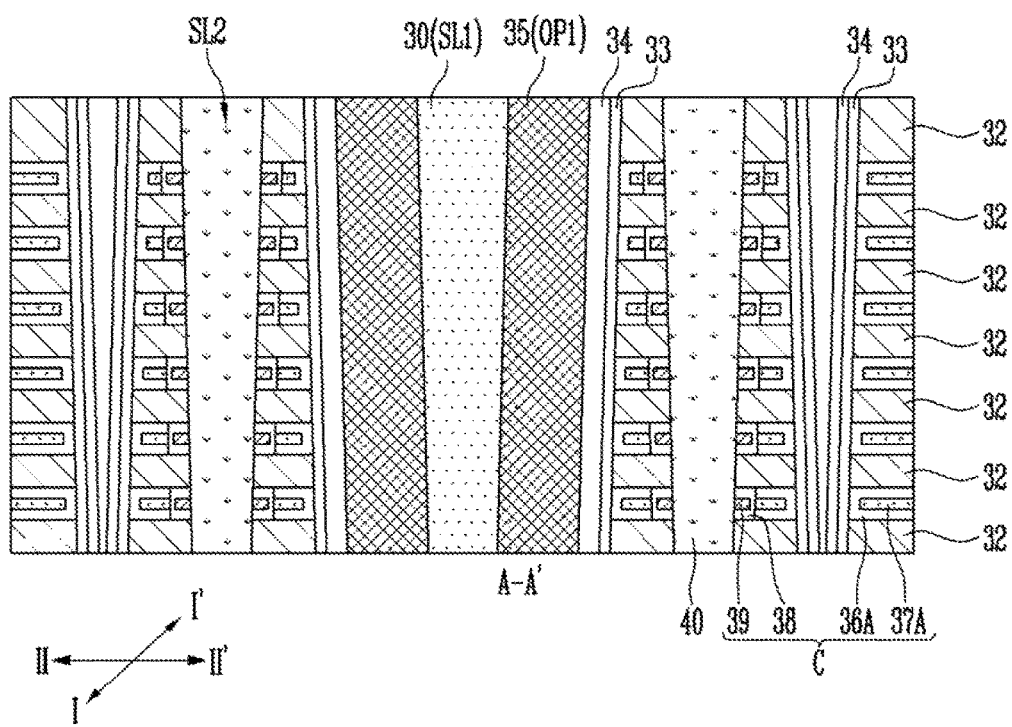

As illustrated in FIG. 3F, second barrier layers 38 and metal layers 39 may be formed in the re-opened second openings OP2. The first barrier patterns 36A, the protective pattern 37A, the second barrier layers 38, and the metal layers 39 collectively form conductive layers C. Subsequently, second slit insulating layers 40 may be formed in the second slits SL2.

According to the above-described processes, when the sacrificial layers 31 are replaced by the conductive layers C, the conductive layers C may be formed by filling different materials by taking into consideration the distance from the second slit SL2. More specifically, the first barrier patterns 36A and the protective patterns 37A may be formed in a region relatively distant from the second slit SL2, and the second barrier layers 38 and the metal layers 39 may be formed in a region relatively close to the second slit SL2. Therefore, gas used to form metal may be prevented from remaining in the conductive layer C. In addition, even when the air gap AG remains during the process of forming the conductive layer C, the air gap AG may be sealed by the blocking pattern 35 and layers existing in the cell region CELL may be protected from being damaged by an etchant flowing through the air gap AG.

FIGS. 2A and 2B show another embodiment. Unlike the embodiment shown in FIGS. 1A and 1B, the processes of forming the first slit SL1 and the first slit insulating layer 30 may be skipped. The distance between the neighboring semiconductor patterns 34 in the first direction I-I' may be smaller than the distance between the neighboring semiconductor patterns 34 in the second direction II-II'. In addition, the blocking pattern 35 may contact four neighboring semiconductor patterns 34 in the first direction I-I' and the second direction II-II'. The air gap AG may be formed between the neighboring semiconductor patterns 34 in the second direction II-II'.

Figure 4:
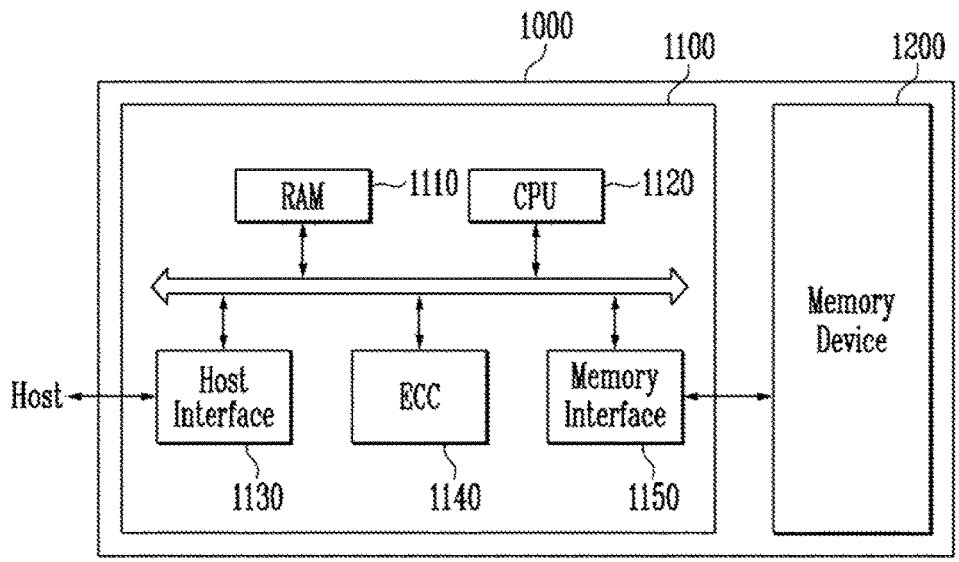
FIG. 4 is a block diagram illustrating the configuration of a memory system according to an embodiment.

FIG. 4 is a block diagram illustrating a memory system according to an embodiment.

As illustrated in FIG. 4, a memory system 1000 according to an embodiment may include a memory device 1200 and a controller 1100.

The memory device 1200 may be used to store various types of data such as text, graphic, and software code. The memory device 1200 may be a non-volatile memory and include the structure described above and shown in FIGS. 1A to 3F. The memory device 1200 may include a stacked structure including conductive layers and insulating layers stacked alternately with each other, first semiconductor patterns passing through the stacked structure and arranged in a first direction, second semiconductor patterns adjacent to the first semiconductor patterns in a second direction crossing the first direction and arranged in the first direction, air gaps located between the first semiconductor patterns and the second semiconductor patterns and extending in the first direction, and at least one blocking pattern passing through the stacked structure and filling portions of the air gaps. Since the memory device 1200 is configured and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data, which is read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data externally transferred through the host interface 1130, or temporarily store data transferred from the memory device 1200 through the memory interface 1150. The controller 1100 may further include ROM storing code data to interface with the host.

Since the memory system 1000 according to an embodiment includes the memory device 1200 having improved structural stability, simplified manufacturing processes and improved degree of integration, stability and degree of integration of the memory system 1000 may also be improved.

Figure 5:
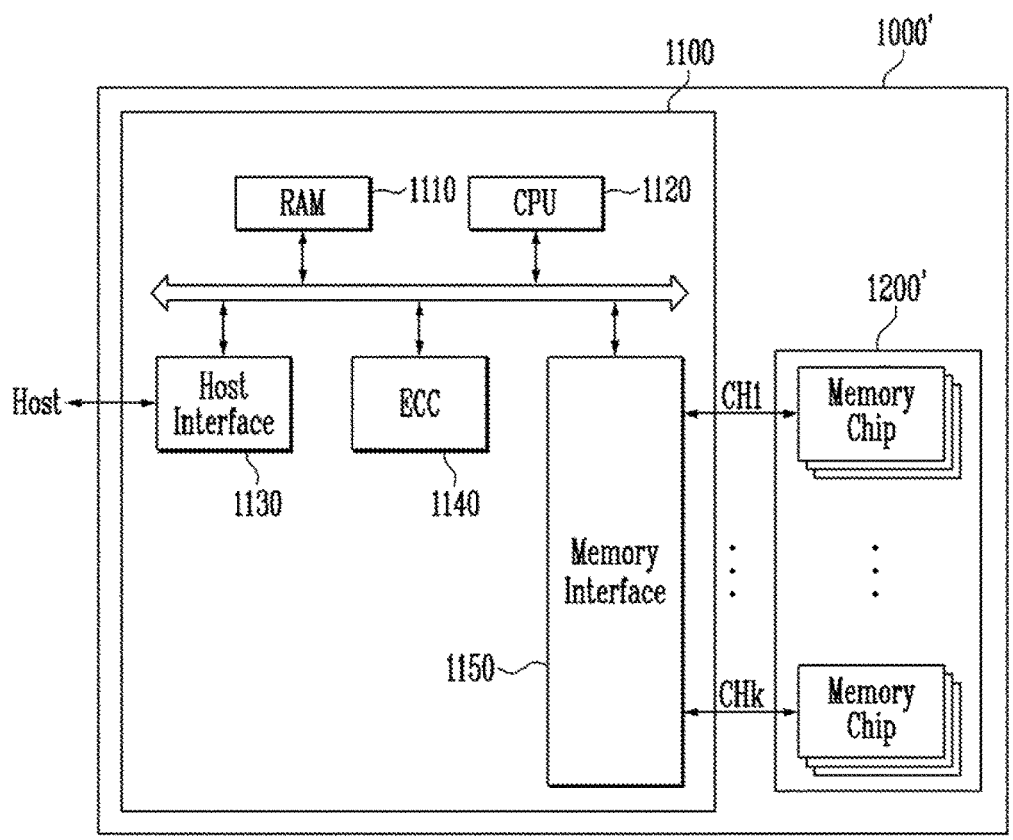
FIG. 5 is a block diagram illustrating the configuration of a memory system according to an embodiment.

FIG. 5 is a block diagram illustrating a memory system according to an embodiment. Hereinafter, descriptions of components already mentioned above are omitted.

As illustrated in FIG. 5, a memory system 1000' according to an embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may include the memory strings described above with reference to FIGS. 1A to 3F. The memory device 1200' may include a stacked structure including conductive layers and insulating layers stacked alternately with each other, first semiconductor patterns passing through the stacked structure and arranged in a first direction, second semiconductor patterns adjacent to the first semiconductor patterns in a second direction crossing the first direction and arranged in the first direction, air gaps located between the first semiconductor patterns and the second semiconductor patterns and extending in the first direction, and at least one blocking pattern passing through the stacked structure and filling a portion of the air gaps. Since the memory device 1200' is configured similar to the memory device 1200 and can be manufactured in a similar method as the above-described manufacturing method employed for the memory device 1200, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, according to an embodiment, since the memory system 1000' includes the memory device 1200' having improved structural stability, simplified manufacturing processes and increased degree of integration, stability and degree of integration of the memory system 1000' may also be improved. In addition, since the memory device 1200' is formed using a multi-chip package, data storage capacity and driving speed of the memory system 1000' may be further increased.

Figure 6:
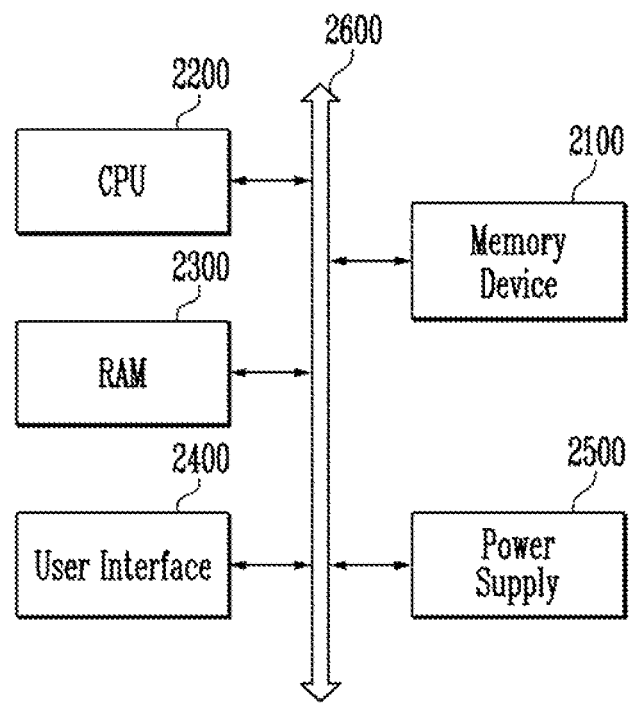
FIG. 6 is a block diagram illustrating the configuration of a computing system according to an embodiment.

FIG. 6 is a block diagram illustrating a computing system according to an embodiment. Hereinafter, descriptions of components already mentioned above are omitted.

As illustrated in FIG. 6, a computing system 2000 according to an embodiment may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or be directly coupled to the system bus 2600. When the memory device 2100 is directly coupled to the system bus 2600, functions of the controller may be performed by the CPU 2200 and the RAM 2300.

The memory device 2100 may be a non-volatile memory. The memory device 2100 may be the semiconductor memory strings described above with reference to FIGS. 1A to 3F. The memory device 2100 may include a stacked structure including conductive layers and insulating layers stacked alternately with each other, first semiconductor patterns passing through the stacked structure and arranged in a first direction, second semiconductor patterns adjacent to the first semiconductor patterns in a second direction crossing the first direction and arranged in the first direction, air gaps located between the first semiconductor patterns and the second semiconductor patterns and extending in the first direction, and at least one blocking pattern passing through the stacked structure and filling a portion of the air gaps. Since the memory device 2100 is configured and manufactured in the same manner as the memory devices 1200 or 1200', a detailed description thereof will be omitted.

In addition, as described above with reference to FIG. 5, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to an embodiment includes the memory device 2100 having improved structural stability, simplified manufacturing processes, and increased degree of integration, stability and data storage capacity of the computing system 2000 may be improved.

Figure 7:
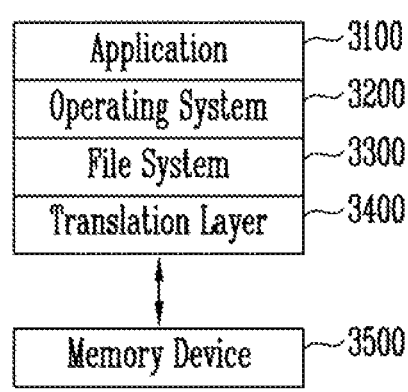
FIG. 7 is a block diagram illustrating the configuration of a computing system according to an embodiment.

FIG. 7 is a block diagram illustrating a computing system according to an embodiment.

As illustrated in FIG. 7, a computing system 3000 according to an embodiment may include a software layer that has an operating system 3200, an application 3100, a file system 3300, and a translation layer 3400. The computing system 3000 may include a hardware layer such as a memory system 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 7 illustrates the operating system 3200, the application 3100, and the file system 3300 in separate blocks. However, the application 3100 and the file system 3300 may be included in the operating system 3200.

The translation layer 3400 may translate an address suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device described above and shown in FIGS. 1A to 3F. The memory device 3500 may include a stacked structure including conductive layers and insulating layers stacked alternately with each other, first semiconductor patterns passing through the stacked structure and arranged in a first direction, second semiconductor patterns adjacent to the first semiconductor patterns in a second direction crossing the first direction and arranged in the first direction, air gaps located between the first semiconductor patterns and the second semiconductor patterns and extending in the first direction, and at least one blocking pattern passing through the stacked structure and filling a portion of the air gaps. Since the memory device 3500 is configured and manufactured the same as the memory devices 1200, 1200' or 2100, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to an embodiment includes the memory device 3500 having improved structural stability, simplified manufacturing processes, and increased degree of integration, so that stability and data storage capacity of the computing system 2000 may be improved.

According to an embodiment, when a semiconductor device having a three-dimensional structure is manufactured, it may be easier to replace sacrificial layers with conductive layers. In addition, the layers in the cell region may be prevented from being damaged when the sacrificial layers are replaced by the conductive layers, and deterioration of characteristics of a memory device may be prevented.

What is claimed is:

1. A semiconductor device, comprising:
a stacked structure including conductive layers and insulating layers stacked alternately with each other;
first semiconductor patterns arranged in a first direction and each of the first semiconductor patterns passes through the stacked structure in a stacking direction;
second semiconductor patterns arranged in the first direction and adjacent to the first semiconductor patterns in a second direction crossing the first direction, wherein each of the second semiconductor patterns passes through the stacked structure in the stacking direction;
wherein the conductive layers include air gaps between the first semiconductor patterns and the second semiconductor patterns, respectively, so that the air gaps and the insulating layers are alternately stacked between tire first semiconductor patterns and the second semiconductor patterns
at least one blocking pattern passing through the stacked structure in the stacking direction and filling at least portions of the air gaps; and
a slit insulating layer located between the first semiconductor patterns and the second semiconductor patterns and having substantially the same height as the at least one blocking pattern.

2. The semiconductor device of claim 1, wherein the at least one blocking pattern contacts at least one of the first and second semiconductor patterns.

3. The semiconductor device of claim 2, wherein the first and second semiconductor patterns include a channel layer and a dummy channel layer, and
wherein the at least one blocking pattern contacts the dummy channel layer.

4. A semiconductor device, comprising:
a stacked structure including conductive layers and insulating layers alternately stacked;
first semiconductor patterns arranged in a first direction and each of the first semiconductor patterns passes through the stacked structure in a stacking direction;
second semiconductor patterns arranged in the first direction and adjacent to the first semiconductor patterns in a second direction crossing the first direction, wherein each of the second semiconductor patterns passes through the stacked structure in the stacking direction;
air gaps located between the first semiconductor patterns and the second semiconductor patterns and extending in the first direction;
at least one blocking pattern passing through the stacked structure in the stacking direction and filling at least portions of the air gaps; and
a slit insulating layer located between the first semiconductor patterns and the second semiconductor patterns, having substantially the same height as the at least one blocking pattern, contacting the at least one blocking pattern, and extending in the first direction,
wherein a first distance between the first semiconductor patterns adjacent to each other in the first direction is smaller than a second distance between the first semiconductor patterns and the slit insulating layer, and
wherein a third distance between the second semiconductor patterns adjacent to each other in the first direction is smaller than a fourth distance between the second semiconductor patterns and the slit insulating layer.

5. The semiconductor device of claim 4, wherein the air gaps are located between the first semiconductor patterns and the slit insulating layer and between the second semiconductor patterns and the slit insulating layer.

6. The semiconductor device of claim 4, wherein the first semiconductor patterns are located in a first memory block,
wherein the second semiconductor patterns are located in a second memory block, and
wherein the slit insulating layer is located at a boundary between the first memory block and the second memory block.

7. The semiconductor device of claim 4, wherein the at least one blocking pattern contacts the slit insulating layer and at least one of the first or the second semiconductor patterns, and
wherein the slit insulating layer is provided between the first and the second semiconductor patterns.

8. The semiconductor device of claim 1, wherein a first distance between the first semiconductor patterns adjacent to each other in the first direction is smaller than a third distance between the first and second semiconductor patterns adjacent to each other in the second direction, and
wherein a second distance between the second semiconductor patterns adjacent to each other in the first direction is smaller than the third distance.

9. The semiconductor device of claim 8, wherein the at least one blocking pattern contacts the first and second semiconductor patterns which are adjacent to each other in the second direction.

10. The semiconductor device of claim 1, wherein the at least one blocking pattern includes an insulating material or a semiconductor material.

11. The semiconductor device of claim 1, wherein the air gaps are formed between the insulating layers stacked on top of one another, and the air gaps are stacked on top of one another.

12. The semiconductor device of claim 1, further comprising:
first multilayer dielectric layers surrounding the first semiconductor patterns; and
second multilayer dielectric layers surrounding the second semiconductor patterns,
wherein the at least one blocking pattern passes through at least one of the first and the second multilayer dielectric layers and contacts at least one of the first and the second semiconductor patterns.

13. A semiconductor device, comprising:
a first slit insulating layer extending in one direction;
a second slit insulating layer extending in the one direction;
a semiconductor pattern provided between the first and the second slit insulating layers,
a first stack structure including air gaps and first insulating layers alternately stacked on each other and provided between the first slit insulating layer and the semiconductor pattern;
a second stack structure including conductive layers and second insulating layers alternately stacked on each other and provided between the second slit insulating layer and the first stack structure, wherein the semiconductor pattern passes through the second stack structure; and
a blocking pattern passing through the first stack structure and extending from the first slit insulating layer through the first stack structure to the semiconductor pattern,
wherein the first slit insulating layer has substantially the same height as the blocking pattern.

14. The semiconductor device of claim 13, further comprising:
a multilayer dielectric layer provided between the semiconductor pattern and the second stack structure.

15. The semiconductor device of claim 14, wherein the blocking pattern passes through the multilayer dielectric layer to contact the semiconductor pattern.

16. The semiconductor device of claim 13, wherein the semiconductor pattern is a dummy pattern and provided in a boundary between a cell region and a contact region.

17. The semiconductor device of claim 13, wherein each of the air gaps and each of the conductive layers are located at substantially the same level.

* * * * *

UNITED STATES PATENT AND TRADEMARK OFFICE
CERTIFICATE OF CORRECTION

| | |
|---|---|
| PATENT NO. | : 9,583,423 B2 |
| APPLICATION NO. | : 14/531671 |
| DATED | : February 28, 2017 |
| INVENTOR(S) | : Woo Yung Jung |

It is certified that error appears in the above-identified patent and that said Letters Patent is hereby corrected as shown below:

In the Specification

In Column 12, Line 10, please change "tire first" to --the first--.

Signed and Sealed this
Ninth Day of January, 2024

Katherine Kelly Vidal
*Director of the United States Patent and Trademark Office*